United States Patent [19]

Cook et al.

[11] 4,250,588

[45] Feb. 17, 1981

[54] BENCH TOP PRINTED CIRCUIT BOARD SCRUBBING DEVICE

[75] Inventors: Floyd R. Cook, Colton; Luis Anzil, Anaheim, both of Calif.

[73] Assignee: Par Enterprises, Anaheim, Calif.

[21] Appl. No.: 17,191

[22] Filed: Mar. 5, 1979

[51] Int. Cl.³ ............................................. A46B 13/04
[52] U.S. Cl. ........................................ 15/77; 51/5 R; 51/78
[58] Field of Search .................. 15/77, 102, 3.17; 51/23, 78, 80 A, 87 R, 5 R, 22

[56] References Cited

U.S. PATENT DOCUMENTS

| | | |
|---|---|---|
| 2,453,339 | 11/1948 | Peterson . |
| 2,871,535 | 2/1957 | Phillips et al. . |
| 3,249,958 | 5/1966 | Haracz . |
| 3,266,074 | 8/1966 | Wehr ........................................ 15/77 |
| 3,636,662 | 1/1972 | Maca . |
| 3,682,079 | 8/1972 | Cassin, Jr. . |
| 3,795,931 | 3/1974 | Martino . |
| 4,017,982 | 4/1977 | Goffredo . |
| 4,107,807 | 8/1978 | Nash, Jr. ................................ 15/77 |

Primary Examiner—Edward L. Roberts
Attorney, Agent, or Firm—Knobbe, Martens, Olson, Hubbard & Bear

[57] ABSTRACT

A bench top printed circuit board scrubber apparatus is disclosed having a roller conveyor for transporting varying thickness circuit boards through a scrubbing and drying compartment. The apparatus includes a pivotal top plate which mounts a scrubber brush and its respective motor drive such that the brushing assembly may be extended away from the roller conveyor as a unit to facilitate easy access to the internal components. Additionally, the apparatus provides a quick change mounting means for the roller conveyor, and a compact axial flow air drying system which effectively dissipates water applied to the circuit board during the scrubbing operation.

5 Claims, 5 Drawing Figures

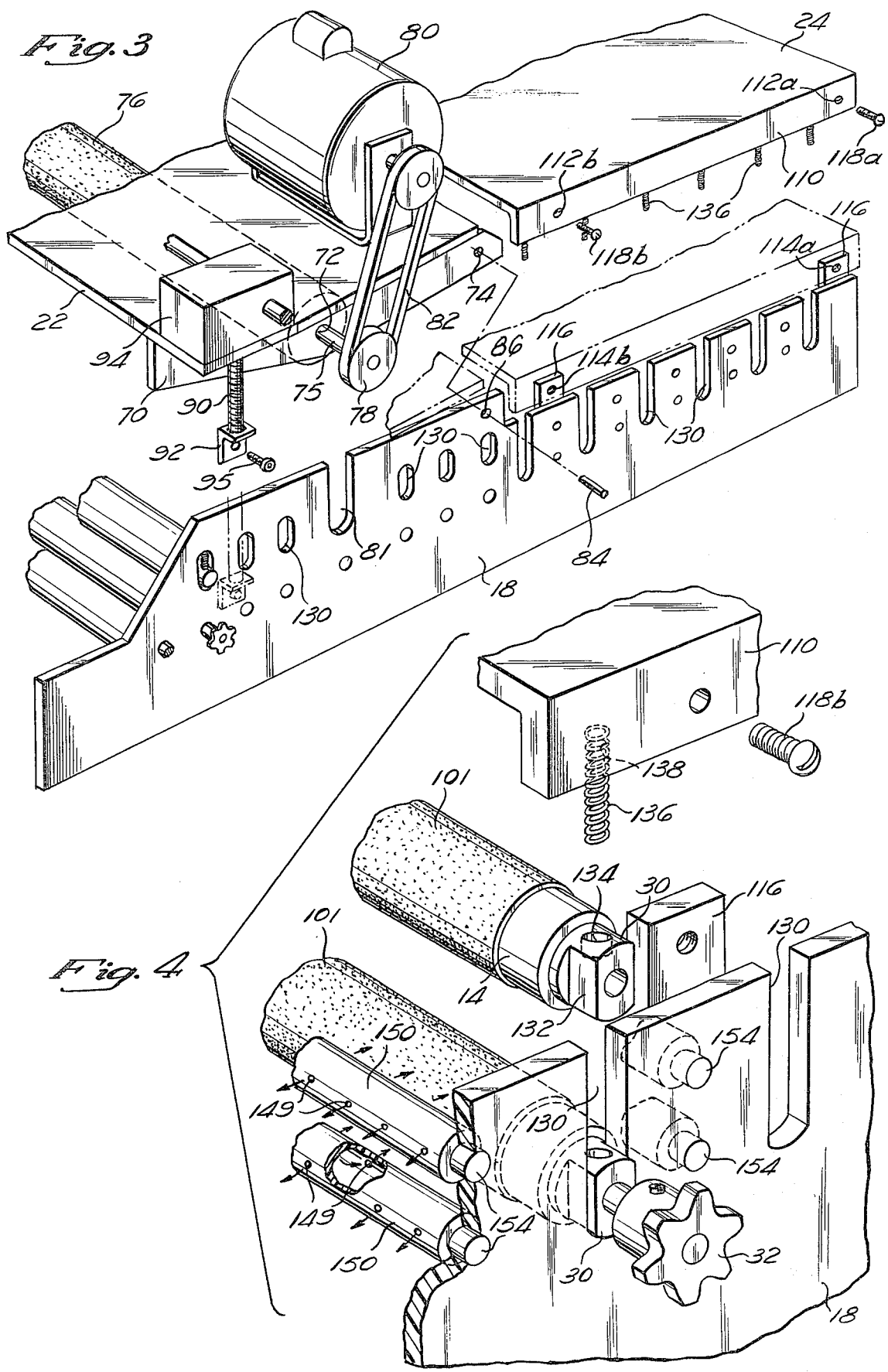

BENCH TOP PRINTED CIRCUIT BOARD SCRUBBING DEVICE

BACKGROUND OF THE INVENTION

The present invention relates to scrubber machines for cleaning planar substrates and more particularly to a scrubber machine suitable for cleaning printed circuit boards.

With the advent of printed circuit board technology, small and large manufacturers alike have found it expedient to design and produce their own circuit boards which, as is well known, may be mass produced at a fraction of the cost of hand wired circuitry. Typically, in the fabrication of printed circuit boards by one of the well known photo etching or silk screening processes, undesirable copper or silver oxides are formed on the outer surfaces of the circuit board. To ensure a proper electrical connection between the printed circuit and the various component parts subsequently mounted thereon, it is necessary that these oxides be removed from the printed circuit board.

The most widely utilized prior art apparatus for cleaning the surfaces of printed circuit boards has been composed of a plurality of rollers oriented to form a conveyor transport which feeds a printed circuit board beneath a rotating cylindrical brush. The cylindrical brush is preferably formed with a fine dispersion of mineral particles which abrasively remove the oxide and other unwanted matter from the surface of the printed circuit board without damaging the printed circuit itself.

To enhance the finish of the scrubbed surface, a water irrigation system has been utilized to flood the roller as well as the printed circuit board during the cleaning operation. As is well known, this wet brushing process forms a hydroxide coating on the printed circuit board which reduces the subsequent formation of oxides after cleaning, as well as promotes the adherence of solder and electrical components to the printed circuit board.

Although such prior art machines have proven to be a substantial improvement over the hand-polishing pumice-slurry procedures previously utilized, they have serious deficiencies in their general use.

The most significant of these deficiencies have focused on the prior art's relatively large size and high investment cost which has significantly prohibited their widespread use by small manufacturers; their complicated and intricate part designs and mounting configurations which have required an inordinate amount of down time for replacement of worn machine parts; and their limited access to the internal components of the apparatus which has hindered easy cleaning and preventative maintenance upon the machine.

In particular, most of the prior art printed circuit board scrubbers, such as that disclosed in MACA U.S. Pat. No. 3,636,662, have been relatively large and expensive apparatus typically including a rigid free-standing frame which supports a roller conveyor and brush assembly as well as a plurality of heater, blower pump, and motor components. The use of the free-standing frame and auxiliary mounted components has required the user to allocate a substantial amount of floor space within his production facility to the scrubber device, and additionally hard-wire install the device in a permanent location. As will be recognized, such large prior art devices resulted in rather high initial investment and setup costs and additionally significantly inhibited the user from relocating the device at different locations in the plant facility.

Further, the prior art devices typically have been incapable of providing a suitable machine design to facilitate the rapid replacement of both the scrubber brush and conveyor rollers which deteriorate during prolonged use. This particular brush mounting deficiency has been recognized to a limited extent in Martino U.S. Pat. No. 3,795,931, however, due to the rather large and complicated structure disclosed therein, such mounts have not been utilized for mounting both the brush and the roller components. Thus, the majority of prior art apparatus have required the user to expand several hours in disassembling a significant portion of the apparatus to replace both the scrubber brush and conveyor rollers.

Additionally, the prior art scrubber apparatus has heretofore provided only limited access to the internal components of the device. During the scrubbing of the printed circuit board, a substantial amount of oxide dust and dirt particles are liberated from the surface of the circuit board. Although most of this dust and dirt is swept from the machine components by the irrigation system, a small portion often becomes lodged and accumulates in undesirable bearing and contact surfaces. Thus, it is necessary to clean these bearing and roller surfaces periodically during use. However, due to the limited accessibilty and substantial time involved in obtaining access to these components of the prior art machines, the user often failed to perform scheduled preventative maintenance which, after prolonged use, resulted in an overall deterioration or, in extreme cases, complete breakdown of the scrubber device.

Thus, there exists a substantial need for a printed circuit board scrubber which occupies a relatively small space, is portable in nature, facilitates easy replacement of both the scrubbing brush and conveyor rollers, and additionally permits easy access to the internal components of the device.

SUMMARY OF THE PRESENT INVENTION

The present invention provides a significantly improved printed circuit board scrubber apparatus which effectively eliminates the size, brush and roller replacement, and acess deficiencies associated in the prior art.

The printed circuit board scrubber of the present invention comprises a bench top unit which may be easily transferred by user to any desired location within the plant facility. This particular bench top construction is facilitated by the unique compact design of the motors, water reservoir, air blowers and transport systems which are specifically positioned upon the housing at a location wherein their weight and external configurations can be utilized to an advantage.

Although the printed circuit board scrubber of the present invention is relatively small in size, it automatically accommodates a wide size range of printed circuit boards and yields production rates equivalent to the substantially larger prior art apparatus. As such, the present invention can be effectively utilized by both the small and large manufacturer alike.

In combination with its novel bench top design, the printed circuit board scrubber of the present invention additionally is provided with a pivotal top plate disposed over the brushing compartment which mounts both the nylon scrubber brush, as well as its respective driving motor. This particular pivotal top plate design facilitates easy access to the brushing compartment and replacement of the cylindrical brush (typically being accomplished in a manner of minutes) and additionally reduces brush vibration during operation, due to the weight of the motor acting downward through the scrubber brush; thereby urging the brush against the surface of the printed circuit board.

To augment the increased access and maintenance benefits made possible in the brushing compartment, the present invention additionally incorporates a pivotal top plate in the aft dryer compartment of the device to provide access and a quick change mounting means for the rollers of the conveyor contained therein, which the applicant has found to be subject to the most prevalent wear. In the preferred embodiment, each of the roller pairs contained in the dryer compartment are slidingly mounted within an elongate slot and are exclusively maintained therein by a plurality of springs disposed upon the pivotal top plate. Thus, by simply pivoting the aft top plate in an upward direction, a user may remove any of the rollers from the slots and quickly clean or replace the same without removing or adjusting any auxiliary mounting means, thereby substantially decreasing the down time of the device for maintenance operations.

In addition, the present invention discloses a compact dryer system which utilizes a plurality of axial flow air blowers to direct a stream of hot air onto the outer periphery conveyor rollers. Due to the compactness and high flow characteristics of the specific system, effective drying of the circuit boards may be accomplished without the large and costly external drying systems heretofore utilized in the prior art.

DESCRIPTION OF THE DRAWINGS

These and other features of the present invention will become more apparent upon reference to the drawings wherein:

FIG. 3 is an enlarged exploded view of the housing, pivotal top plate, and pivotal rear plate of the circuit board scrubber apparatus of the present invention;

FIG. 4 is an enlarged exploded view of the housing of the printed circuit board scrubber of the present invention illustrating the particular quick change mounting means of the conveyor rollers thereon.

DETAILED DESCRIPTION OF THE PREFERRED EMBODIMENT

Figure 1:
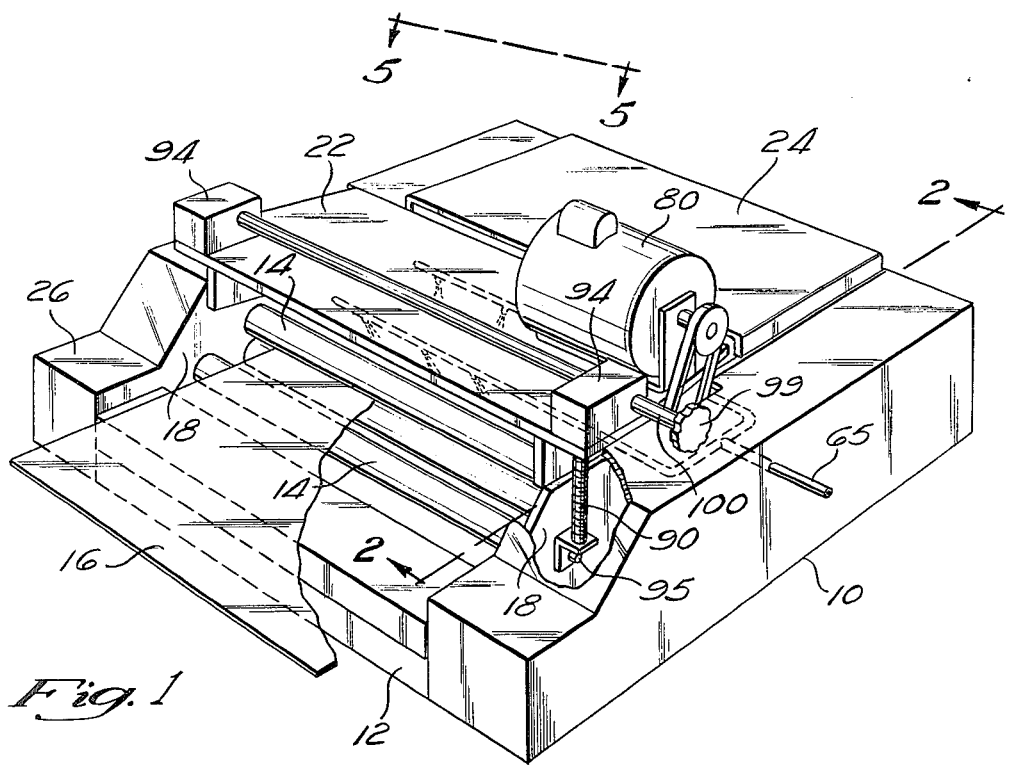
FIG. 1 is a perspective view of the printed circuit board scrubber apparatus of the present invention having a printed circuit board being inserted therein.

Referring to FIG. 1, there is shown the printed circuit board scrubber apparatus 10 of the present invention composed generally of a frame or housing 12 supporting a plurality of elongate rollers 14 which form a conveying means for transporting a printed circuit board 16 in a planar orientation through the device 10.

The frame 12 includes a pair of spaced sidewalls 18 which extend perpendicular to the lower surface 20 of the frame 12 to pivotally mount a frontal top plate 22 and an aft or rear top plate 24. As will become more apparent infra, this pivotal mounting of both the frontal and rear top plates 22 and 24, respectively, facilitates easy access inspection, and/or replacement of the internal components of the apparatus 10. The apparatus 10 additionally includes a pair of side covers 26 which are releasably mounted to the outboard side of the sidewalls 18 to shield a user from accidental contact with the chain drive mechanism 34 and air blower system 160 (shown in FIGS. 2 and 5, respectively).

Figure 2:
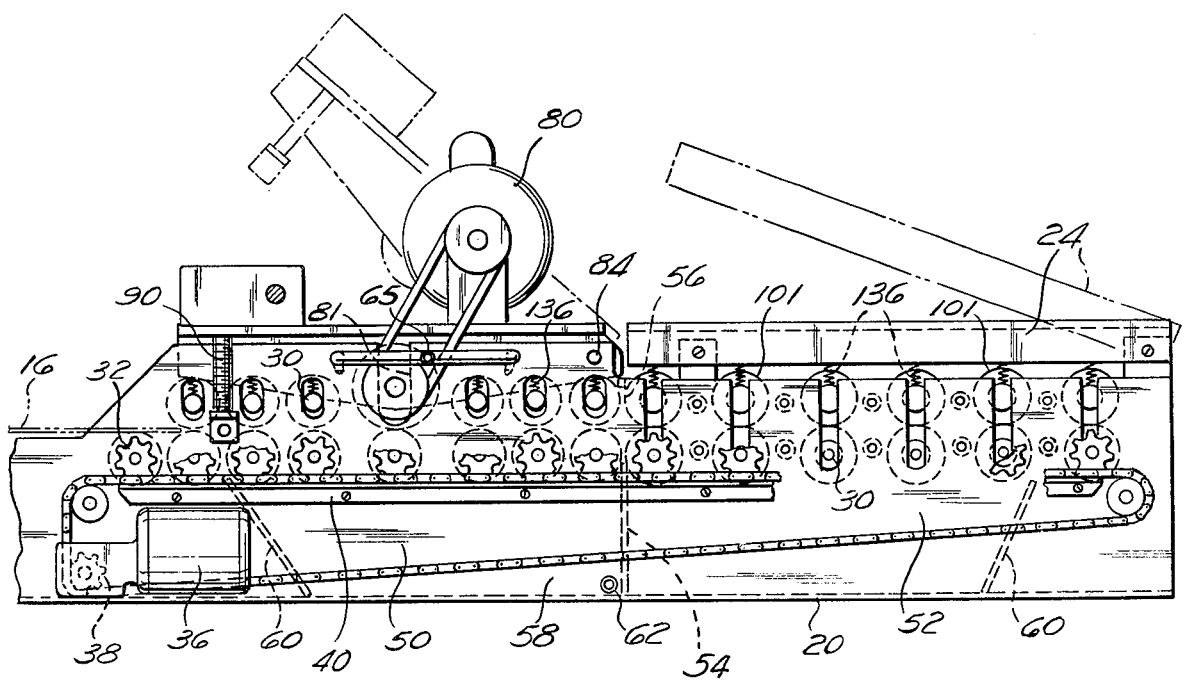
FIG. 2 is an enlarged cross-sectional view of the printed circuit board scrubber of the present invention taken about lines 2—2 of FIG. 1.

Referring to FIG. 2, the detailed construction and spacial relationships between the component parts of the printed circuit board scrubber 10 of the present invention may be described. It will be noted that for purposes of illustration, the right side cover 26 (as viewed in FIG. 1) has been removed from the sidewall 18 of the frame 12. As shown, the plural conveyor rollers 14 are arranged in vertically stacked pairs and extend horizontally throughout the length of the apparatus 10 being supported at opposite ends thereof by bearings 30 secured to the sidewalls 18 of the frame 12.

The lower course of rollers 14 each include a gear sprocket 32 positioned outboard of the sidewall 18 which mates with a chain drive loop 34. A variable speed motor drive 36 preferably having its output shaft (not shown) oriented parallel to the lower surface 20 of the frame 12 is additionally provided to drive the chain loop 34 through a suitable gear reduction unit 38. As will be recognized, by orienting the drive motor 36 in such a manner, the motor 36 is maintained proximal the sidewall 18 of the frame 12, thereby reducing the overall size of the apparatus 10.

To maintain the engagement between the sprockets 32 and chain loop 34, a chain guide 40 is mounted to the sidewall 18 extending horizontally adjacent the upper rim of the chain loop 34. It will be noted, however, that other means for maintaining the tension within the chain loop 34, such as an idler gear (not shown) may be utilized without departing from the spirit of the present invention.

Each of the rollers 14 of the upper course of the roller conveyor preferably have their bearings 30 mounted in an elongate slot 130 formed in the sidewall 18. As will be described in more detail infra, each of these bearings 30 are biased in a downward direction by a spring 136 disposed on the upper surface of the bearing 30 such that the peripheries of the upper and lower roller pairs 14 tightly contact one another.

Due to this biased contact, it will be recognized that by driving the lower rollers 14 through the chain loop 34 and motor drive 36, the upper and lower course of rollers 14 will simultaneously rotate in opposed directions. Additionally, as the circuit board 16 is fed between the roller courses 14, the lower roller course conveys the circuit board 16 there along whereas the upper roller course merely rotates (in a manner similar to an idler gear) along the top surface of the board in response to the travel of the circuit board 16. As such, the circuit board 16 may be transported throughout the length of the apparatus 10 without the need of independently driving the upper course of rollers 14. Further, it will be noted that since the upper course of rollers 14 are biased downward in the elongate slots 130, the upper roller course is urged away from the lower roller course 14 as the circuit board 16 travels through the apparatus 10 and as such automatically accommodates varying thicknesses of circuit boards. Further, the applicant has found that this specific roller conveying means is particularly suitable for maintaining a planar horizontal configuration of thin flexible circuit boards (typically 0.020 inch) which in the past have had a tendency to flex and deform in their transport through the scrubber device.

As best illustrated in FIG. 2, the printed circuit board scrubber 10 of the present invention is preferably segregated into a brushing compartment 50 and a drying compartment 52 by a wall partition 54 which extends perpendicularly between the sidewalls 18. The lower portion of the partition 54 resides within a drain reservoir 58 defined by a pair of inclined splash walls 60 and the lower surface 20. This reservoir 58 receives the water runoff entering the brushing compartment 50 through the brush nozzle 61 and rinsing nozzle 63 of the irrigation system 65.

As shown, the partition 54 is provided with an opening 56 intermediate its length thereof, which permits the printed circuit board 16 to travel upon the rollers 14 across partition 54. Additionally, the lower end of the partition 54 is spaced from the bottom surface 20 of the device such that any water remaining on the circuit board 16 and entering the reservoir 58 from the drying compartment 52 may flow to the drain outlet 62 disposed on the sidewall 18.

The scrubber compartment 50 is provided with a frontal top plate 22 which extends beyond the sidewalls 18 and forms a top surface for the compartment 50. As best shown in FIG. 3, this frontal plate 22 is formed as a generally planar member having a pair of strengthening arms 70 rigidly attached to its lower surface and extending throughout the length adjacent opposite sides. Each of the arms 70 are provided with a pair of apertures 72 and 74 which are positioned centrally and adjacent one end of the arms 70, respectively.

As shown, the central apertures 72 each receive one end of a shaft 75 which carries the printed circuit brush 76. Such printed circuit brushes 76 are well known in the art and are typically composed of a nylon mesh often impregnated with fine particles of silicon carbide or the like; a particular one of which is marketed under the name Scotch Brite; a registered trademark of the 3M Company.

The shaft 75 mounting the cylindrical brush 76 is supported within the apertures 72 by suitable bearings (not shown) and includes a pulley 78 mounted outboard of one of the supporting arms 70. The pulley 78 is interconnected to a driving motor 80 mounted on the top surface of the plate 22 by way of a V-belt 82 whereby rotation of the driving motor 80 causes a corresponding rotation of the shaft 75 and cylindrical brush 76.

In the preferred embodiment, the frontal top plate 22 is pivotally mounted adjacent one end by a pair of pins 84, each extending through a respective one of the apertures 74 formed on the supporting arms 70 and frictionally mating with an aperture 86 formed adjacent the top surface of each of the sidewalls 18. These pins 84 form a pivot axis for the top plate 22 which allows the top plate 22 having the brush 76 and motor 80 mounted thereon to be rotated, as a single unit, upward (clockwise) away from the rollers 14. To facilitate the lowering of the brush 76 upon the circuit board 16, the sidewalls 18 of the frame 12 are provided with a clearance slot 81 which extends substantially into the scrubber chamber 50. The width of the slot 81 is sized slightly greater than the diameter of the brush shaft 75 such that as the top plate 22 is pivoted about the pins 84, the shaft 75 does not contact the sidewalls 18.

The opposite end of the plate member 22 is supported upon a pair of threaded rods 90 each mating with a gear box 94 at one end thereof and including an L-shaped flange 92 at their opposite ends which may be releasably attached to the sidewalls 18 of the frame 12 by way of a threaded fastener 95. The gear boxes 94, rigidly attached to the top plate 22, are adapted to be driven by a common drive shaft 100 and are constructed in a well known manner such that as the shaft 100 is manually rotated, the threaded rods 90 reciprocate vertically within the interior of the gear boxes 94. 96. Thus, with the top plate pivoted about the pins 84 and supported by the threaded rods 90, manual rotation of the shaft 100 raises and lowers the top plate 22 and the cylindrical brush 76 relative the conveyor rollers 14 thereby providing an adjustment means for varying the frictional forces exacted by the brush 76 against the circuit board 16.

As will be recognized by the novel pivotal top plate 22 of the present invention, a user may obtain easy access to the internal components contained within the scrubber chamber 50 simply by removing the threaded fasteners 95 from the L-shaped flanges 92 and pivoting the top plate 22 in a clockwise direction about the pins 84 to assume a position indicated by the phantom lines in FIG. 2. As such, the brush 76, motor 80, and V-belt 82 may be swung as a single unit away from the conveyor rollers 70 without the need of any auxiliary disconnectors or disassemblies.

Once disposed in this pivotal position, the cylindrical brush 76 may be inspected or alternatively replaced in a manner of minutes, simply by removing the pulley 78 from the shaft 75 and sliding the shaft 75 axially whereby one end of the shaft is disengaged from one of the apertures 72 formed in the supporting arm 70. Subsequently, the shaft 75 may be inclined and removed from the other aperture 72 wherein the brush 76 may be replaced upon the shaft 75 and remounted to the top plate by reversing the above steps.

Additionally, in this extended (pivoted) position, direct access to the rollers 14 is provided whereby a user may quickly remove any debris or dirt accumulated in the scrubber chamber 50 by either a towel or air hose (not shown) thereby effectively preventing the degradation of the apparatus 10.

To augment the increased accessibility and component replacement benefits made possible by the pivotal plate 22, the dryer compartment 52 of the apparatus 10 is additionally provided with a pivotal mounted aft or rear top plate 24. As with the frontal top plate 22, the aft plate 24 is formed as a generally planar member but preferably includes a pair of sidewalls 110 extending substantially perpendicular thereto. As shown, each of the sidewalls 110 is provided with an aperture 112 adjacent opposite ends thereof which align with a pair of threaded apertures 114 formed in a respective mounting dog 116 disposed on the inboard side of the sidewalls 18.

In the preferred embodiment, the respective pairs of apertures 112A and 114A receive a threaded fastener 118 which forms a pivot for the aft plate 24. As will be recognized, when mounted in such a manner, the aft plate 24 may be rotated upward about the pins 118A to assume a position indicated by the phantom lines in FIG. 2. Alternatively, to maintain the aft plate 24 in its lowered position upon the upper edge of the sidewalls 18, an additional pair of fasteners 118B may be selectively inserted into the aligned apertures 112B and 114B. Thus, it will be recognized that by merely removing the two mounting screws 118B from the apertures 112B, the aft or rear top plate 24 may be pivoted about the pin 118A thereby permitting access to the dryer compartment 52.

In the preferred embodiment, the rollers 14 located within the drying compartment 52 are each provided with a fabric sock 101 (shown in FIG. 4) which extends tightly about the periphery of the rollers 14. These socks 101 are preferably formed of a soft absorbent material such that any water remaining on the circuit board 16 upon passage through the scrubber compartment 50 will be effectively removed therefrom upon completion of the circuit board's travel through the dryer compartment 52.

The applicant has found, however, that these socks 101 and rollers 14 disposed within the dryer compartment 52 are subject to the most prevalent wear during operation and, hence, must be inspected and/or replaced periodically. Thus, to facilitate the rapid inspection or replacement of the socks 101, the present invention provides a quick-change mounting means to the rollers 14 contained within the dryer chamber 52 wherein the pivotal aft plate 24 is utilized to provide the sole retaining means for the rollers 14.

Referring to FIGS. 3 and 4, it may be seen that the sidewalls 18 of the frame 12 extending within the dryer compartment 52 are provided with a plurality of elongate slots 130. The width of each of these slots 130 is sized to slidingly receive the flats 132 formed on the ends of the roller bearings 30 while their length is sized to be slightly greater than the combined peripheral diameters of both the upper and lower rollers 14 such that each of the slots 130 can register and mount a pair of rollers 14 in a stacked orientation.

As shown, each of the bearings 30 is provided with an annular recess 134 which is oriented parallel to the flats 132. The recesses 134 disposed on the upper course of rollers 14 receives one of the plural springs 136 extending from a pocket 138 formed in the sidewalls 110 of the aft plate 24. As will be recognized, with the aft plate 24 lowered in its operational position (i.e., with the sidewalls 110 of the plate 24 resting upon the upper edges of the sidewalls 18), each of the springs 136 tightly bias the upper and lower rollers 14 toward the lower end of the slot 130 whereby rotation of the lower rollers 14 by way of the sprocket 32, causes the upper rollers 14 to similarly rotate in an opposed direction.

When inspection or removal of one of the rollers 14 in the dryer compartment 52 is desired, a user need only pivot the aft top plate 24 upward (in a manner previously described) whereby the springs 136 disposed in the pockets 138 of the sidewalls 110 are removed from the recesses 134 formed in each of the bearings 30. It will be recognized that once the plate 24 is pivoted upward, the desired rollers 14 are free to be lifted from the slots 130. As such, an individual roller 14 may be selectively removed from the apparatus 10 and have its sock 101 replaced and be remounted in a period of minutes.

Figure 5:
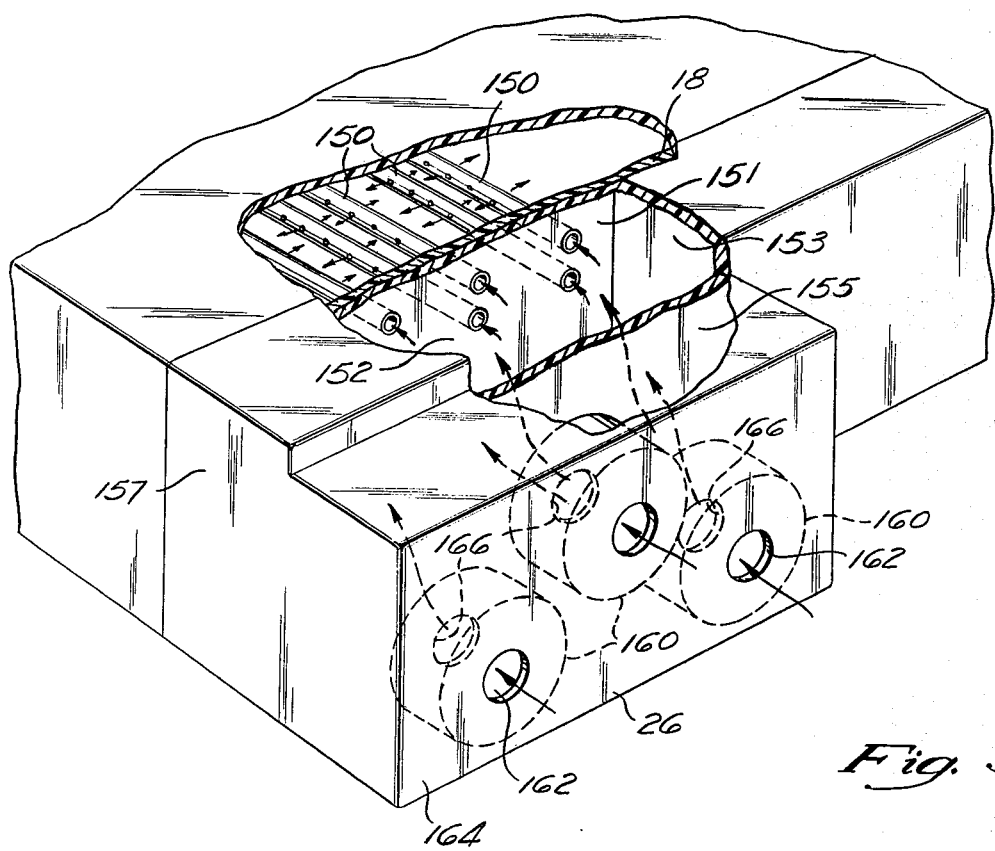
FIG. 5 is an enlarged perspective view of the air blower drying system of the present invention taken about lines 5—5 of FIG. 1.

To effectively maintain the socks 101 extending about the peripheries of the rollers 14 disposed in the drying compartment 52 dry during prolonged use, the present invention discloses a novel compact forced air drying system which is illustrated in FIGS. 4 and 5.

As shown, the drying compartment 52 of the apparatus 10 of the present invention is provided with a plurality of tubular air conduits 150 which extend in a stacked arrangement between the sidewalls 18 of the frame 12 and are disposed between adjacent pairs of rollers 14. Each of the conduits 150 are preferably provided with a plurality of vent apertures 149 extending through the walls of the conduit 150 which are preferably being oriented at 180 degrees from one another to be directed toward adjacent roller pairs 14.

The conduits 150 are sealed at one end by a plug 154 which advantageously mounts the conduit 150 to one of the sidewalls 18 and extend through the opposite sidewalls 18 as shown in FIG. 5 to communicate with an air chamber 152. This chamber 152 is formed within the cover 26 disposed outboard of the sidewall 18 and defined by the spaced walls 151, 153, 155, and 157.

In the preferred embodiment, three axial flow air blowers 160 are provided to communicate with the air chamber 152, having their inlets 162 positioned on the outer wall 164 of the cover 26 and their outlets 166 extending through the wall 155.

In operation, air from the atmosphere is drawn into the inlet 162 of the axial blowers 160 and accelerated through the outlet 166 to enter the air chamber 152. Since the conduits 150 communicating with the air chamber 152 have an effective flow area substantially less than the combined outlets of the axial blowers 160, the air chamber 152 is raised to a pressure substantially above atmospheric conditions. As such, a high velocity air flow travels through each of the conduits 150 and is expelled through the vent apertures 149 formed therein to effectively dry the fabric socks 101 of the rollers 14 during operation. The applicant has found that the axial blowers moderately heat the air traveling therethrough such that an auxiliary resistive heating element is not required in the system.

It will be noted that by use of the axial flow blowers 160 and air chamber 152, the present invention provides an effective drying system which can be directly mounted to the side cover 26, thereby reducing the overall size of the apparatus 10. Further, by such a system, the present invention eliminates the extended heater ducts heretofore found on the prior art printed circuit board scrubber apparatus.

With the structure defined, the operation of the printed circuit board scrubber 10 of the present invention may be described. As shown in FIG. 1, a printed circuit board 16 is inserted between the upper and lower conveyor rollers 14 adjacent one end of the apparatus 10. Due to the lower course of rollers 14 being driven by the chain loop 34 and the upper rollers 14 being spring-biased there against, the circuit board 16 is transferred horizontally between the rollers 14 through the apparatus 10. As previously mentioned, the particular roller conveyor 14 insures that the circuit board 16 (even when an extremely thin circuit board) is transported in a planar configuration through the apparatus 10.

As the circuit board 16 is transferred therethrough, it engages the scrubber brush 76 which has been preset to a desired heighth by the manual turning of the hand wheel 99. The scrubber brush 76 preferably rotating at a speed substantially greater than the travel of the circuit board 16 through the apparatus 10 frictionally engages the top surface of the circuit board 16, thereby effectively removing the oxides and dirt particles adhering to its surface.

During this frictional engagement between the brush 76 and circuit board 16, a continuous flow of water is sprayed onto the brush 76 through a first series of nozzles 61 disposed upstream of the brush 76. As is well known in the art, this water spray effectively cools the brush 76 to prevent any nylon deposits upon the circuit board 16 and additionally reacts with the printed circuit to form a hydroxide coating which assists in the subsequent adherence of solder to the printed circuit board 16. Additionally, the applicant has found that due to the motor drive 80 being located above the brush 76, that vibration during the brushing operation is significantly eliminated thereby yielding a smoother surface finish on the printed circuit board 16.

Upon passing beneath the brush 76, a second spray of water is applied directly to the circuit board 16 through the nozzles 63 which rinses the oxide and dirt particles free during the brushing operation from the surface of the circuit board 16 and carries the same into the drain reservoir 58. During this rinsing process, it will be recognized that the majority of water sprayed onto the circuit board 16 is dissipated by the rollers 14 contacting the circuit board 16 and is maintained upstream of the partition 54 thereby preventing excessive moisture from being deposited upon the rollers disposed in the drying compartment 52.

Subsequently, the printed circuit board 16 enters the drying compartment 52 wherein the socks 101 covering the rollers 14 effectively remove the remaining moisture contained upon the circuit board 16 and expells the circuit board 16 adjacent the end of the frame 12. It will be recognized that due to the air conduits directing a constant flow of air onto the socks 101, that the socks 101 rapidly dissipate any moisture accumulated thereon such that successive circuit boards traveling through the device 10 may be effectively dried by the apparatus.

In summary, it will be recognized that the apparatus 10 of the present invention provides a significant improvement over the prior art printed circuit board scrubber apparatus by providing a low cost, high output bench top scrubber which, due to its pivotal front and rear plate configuration, facilitates easy replacement of both the scrubber brush and rollers as well as providing easy access to the internal components of the apparatus 10.

We claim:

1. A printed circuit board scrubbing apparatus comprising:
    a frame;
    conveying means supported by said frame for transporting a printed circuit board in a planar orientation, said conveying means comprising a plurality of rollers arranged in a first and second course extending along the length of said frame, said courses being vertically aligned with one another, said first roller course engaging means for rotating all of said rollers arranged in said first course, said first and second roller courses biased against one another such that rotation of said first roller course produces a simultaneous opposed rotation of said second roller course;
    brush means for scrubbing said circuit board rotatably disposed upon a plate member pivotally mounted to said frame; and
    driving means for rotating said brush means, said plate member being selectively pivoted in an upward direction from said frame to provide access to said brush means and said conveying means.

2. The apparatus of claim 1 wherein said second roller course is rotated exclusively by said first roller course.

3. A bench top printed circuit board scrubbing apparatus comprising:
    a frame;
    conveying means supported by said frame for transporting a printed circuit board in a planar orientation, said conveyor means comprising a plurality of rollers arranged in a first and second course extending along the length of said frame, said courses being vertically aligned with one another;
    a first plate member pivotally mounted to said frame member and disposed adjacent one end of said frame, including brush means rotatably mounted on one surface of said first plate member for scrubbing said printed circuit board;
    a second plate member pivotally mounted to said frame and disposed adjacent the other end of said frame, including means for biasing said second roller course against said first roller course;
    means for rotating said brush means mounted on the opposite surface of said first plate member; and
    said first and second plate members being pivotally extendable away from said conveying means to provide access to said conveying means.

4. The apparatus of claim 3 wherein said biasing means comprises a plurality of springs mounted to one surface of said plate member and engaging said second roller course.

5. The apparatus of claim 4 wherein said springs maintain said first and second roller courses on said frame.

* * * * *